United States Patent
Patra

(10) Patent No.: US 9,915,874 B2
(45) Date of Patent: Mar. 13, 2018

(54) ILLUMINATION OPTICAL UNIT AND ILLUMINATION SYSTEM FOR EUV PROJECTION LITHOGRAPHY

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 7 days.

(21) Appl. No.: 15/061,048

(22) Filed: Mar. 4, 2016

(65) Prior Publication Data

US 2016/0187784 A1    Jun. 30, 2016

Related U.S. Application Data

(63) Continuation of application No. PCT/EP2014/067961, filed on Aug. 25, 2014.

(30) Foreign Application Priority Data

Sep. 11, 2013 (DE) ........................ 10 2013 218 131

(51) Int. Cl.
*G02B 27/54* (2006.01)
*G03F 7/20* (2006.01)
(Continued)

(52) U.S. Cl.
CPC ............... *G03F 7/702* (2013.01); *G02B 5/09* (2013.01); *G02B 19/0095* (2013.01); *G03F 7/70075* (2013.01); *G03F 7/70116* (2013.01)

(58) Field of Classification Search
CPC ... G03F 7/702; G03F 7/70075; G03F 7/70116
(Continued)

(56) References Cited

U.S. PATENT DOCUMENTS 5,361,292 A    11/1994  Sweatt
6,507,440 B1   1/2003   Schultz
(Continued)

FOREIGN PATENT DOCUMENTS

DE           103 17 667 A1    11/2004
DE      10 2008 009 600 A1    8/2009
(Continued)

OTHER PUBLICATIONS

German Office Action, with translation thereof, for corresponding DE Appl No. 10 2013 218 131.0, dated May 15, 2014.
(Continued)

*Primary Examiner* — Hung Henry Nguyen
(74) *Attorney, Agent, or Firm* — Fish & Richardson P.C.

(57) ABSTRACT

An illumination optical unit for EUV projection lithography serves for illuminating an illumination field in which an object field of a downstream imaging optical unit is arranged. An object displaceable in an object displacement direction is in turn arrangeable in the object field. A facet mirror of the illumination optical unit has a plurality of facets arranged alongside one another and serving for the reflective, superimposing guidance of partial beams of a beam of EUV illumination light to the object field. The facet mirror is arranged such that a position of the respective facet on the facet mirror and an impingement region of an illumination light partial beam on the respective facet of the facet mirror predefine an illumination direction for the field points of the object field.

20 Claims, 10 Drawing Sheets

(51) Int. Cl.
G02B 5/09 (2006.01)
G02B 19/00 (2006.01)

(58) Field of Classification Search
USPC .......................................... 355/52, 53, 67–71
See application file for complete search history.

(56) References Cited

U.S. PATENT DOCUMENTS

| | | | |
|---|---|---|---|
| 7,333,178 B2* | 2/2008 | Dierichs | G03F 7/70075 |
| | | | 355/53 |
| 2006/0132747 A1 | 6/2006 | Singer et al. | |
| 2010/0231882 A1 | 9/2010 | Dinger et al. | |
| 2011/0014799 A1 | 1/2011 | Dinger et al. | |
| 2011/0164233 A1* | 7/2011 | Staicu | G02B 5/0891 |
| | | | 355/67 |

FOREIGN PATENT DOCUMENTS

| | | |
|---|---|---|
| DE | 10 2008 000 967 A1 | 10/2009 |
| DE | 10 2009 032 194 A1 | 4/2010 |

OTHER PUBLICATIONS

International Search Report for corresponding PCT Appl No. PCT/EP2014/067961, dated Feb. 18, 2015.

* cited by examiner

ILLUMINATION OPTICAL UNIT AND ILLUMINATION SYSTEM FOR EUV PROJECTION LITHOGRAPHY

CROSS-REFERENCE TO RELATED APPLICATIONS

The present application is a continuation of, and claims benefit under 35 USC 120 to, international application PCT/EP2014/067961, filed Aug. 25, 2014, which claims benefit under 35 USC 119 of German Application No. 10 2013 218 131.0, filed Sep. 11, 2013. The entire disclosure of international application PCT/EP2014/067961 is incorporated by reference herein.

FIELD

The disclosure relates to an illumination optical unit for EUV projection lithography. Furthermore, the disclosure relates to an illumination system for EUV projection lithography, in particular comprising such an illumination optical unit. Furthermore, the disclosure relates to an optical system comprising such an illumination optical unit, a pupil facet mirror for use in such an illumination optical unit, in such an optical system or in such an illumination system, a projection exposure apparatus comprising such an illumination system, a method for producing a micro- or nanostructured component, and a micro-or nanostructured component produced by such a method.

BACKGROUND

An illumination system for EUV projection lithography is known from U.S. Pat. No. 5,361,292, DE 103 17 667 A1, U.S. Pat. No. 2010/0231882 A1 and from U.S. Pat. No. 6,507,440 B1. A facet mirror arranged such that the position of respective facets, the partial beams of which are transferred into the object field in a manner being superimposed, on the facet mirror, that is to say the spatial position of the facets on the facet mirror, predefines an illumination direction, wherein an edge contour of an impingement of the facet mirror simultaneously predefines a field shape of the object field, is known as a so-called specular reflector for example from DE 103 17 667 A1 and U.S. Pat No. 2010/0231882 A1. Hereinafter, such a facet mirror is also referred to as a specular facet mirror and an individual facet of such a facet mirror is also referred to as a specular facet. In the case of the specular reflector according to DE 103 17 667 A1 and according to U.S. Pat No. 2010/0231882 A1, each of the individual facets is again constructed from a multiplicity of individual micromirrors.

SUMMARY

The disclosure seeks to develop an illumination optical unit such that a specular reflector can be realized with a reduced production outlay in comparison with the prior art.

In one aspect, the disclosure provides an illumination optical unit for EUV projection lithography for illuminating an illumination field with illumination light of an EUV light source. An object field of a downstream imaging optical unit is arranged in the illumination field. An object displaceable in an object displacement direction is arrangeable in the object field. The illumination optical unit includes a specular facet mirror including a plurality of specular facets arranged alongside one another and serving for the reflective, superimposing guidance of partial beams of a beam of the EUV illumination light to the object field. The specular facet mirror constitutes a last component in the beam path of the illumination light for guiding the illumination light upstream of the object field. The specular facet mirror is arranged such that: a position of the respective specular facet on the specular facet mirror and an impingement region of an illumination light partial beam on the respective specular facet of the facet mirror predefined an illumination direction for the field points of the object field; and an edge contour of the impingement region of the illumination light partial beam on the respective specular facet of the specular facet mirror predefines a field shape of the object field. Each of the specular facets has a continuous static reflection surface.

In the solution proposals for a specular reflector as known from the prior art, the individual facets that are imaged into the object field in a manner being superimposed on one another are constructed, for their part, from a plurality or multiplicity of individual mirrors of a micromirror array. In the case of the illumination optical unit according to the disclosure, such a subdivision of the specular facets into micromirrors is avoided. The individual specular facets thus have larger continuous static reflection surfaces, which reduces the production outlay thereof. The specular facet mirror is arranged neither in an image plane of the EUV light source nor in a plane to be imaged into the object field. The specular facets of the specular facet mirror are embodied monolithically, in particular. In principle, even the entire specular facet mirror can be embodied monolithically, since it is not mandatory for the specular facets having the continuous static reflection surfaces to be embodied in a tiltable fashion. Small angular bandwidths of angles of incidence of the EUV illumination light can be achieved on the facets. An individual facet can therefore be impinged on with a small bandwidth of angles of incidence, wherein the absolute angles of incidence with which different facets are impinged on can indeed differ significantly from one another. The angular bandwidth of the angles of incidence on the individual facets can be for example less than 5°, can be less than 4°, can be less than 3° and can also be even smaller. The specular facet mirror can thus be used even for very short EUV wavelengths of the illumination light, for example for wavelengths in the region of 10 nm and lower, for example in the region of 7 nm, with high reflectivity. The specular facet mirror embodied as a specular reflector is a last optical component in the beam path of the illumination light upstream of the object field. Between the specular facet mirror and the object field, therefore, no further illumination optical component is situated in the beam path of the illumination light. Reflection losses of the EUV illumination light can thus be reduced. The specular facets can be arranged alongside one another in one plane on the specular facet mirror. The specular facets can be arranged on a common facet carrier of the specular facet mirror. A further transfer facet mirror can be disposed upstream of the specular facet mirror in the beam path of the illumination light. A beam shaping device can be disposed upstream of the transfer facet mirror in the beam path of the illumination light. Such a beam shaping device can be embodied as a scanner for fanning out an illumination light beam. Alternatively, the beam shaping device can be embodied as a stationary mirror that fans out the illumination light.

The specular facets can be shaped in each case such that, upon complete impingement, via their respective edge contour and the shape of their respective reflection surface, they predefine both the illumination direction for each field point and the field shape for the object field. Such specular facets can be fully illuminated in each case and, therefore, on account of their edge contour, that is to say their boundary shape, and their position, that is to say their spatial arrangement, on the specular facet mirror yield firstly the illumination direction and secondly the field shape. Alternatively, it is possible for the specular facets all to have the same extent along a dimension, for example along a dimension perpendicular to the object displacement direction, and to be impinged on with the illumination light in different impingement regions in order to predefine the respective illumination direction. This facilitates the production of the specular facet mirror.

An edge contour of the specular facets can have an aspect ratio y/x of a first dimension y along the object displacement direction and a second dimension x perpendicular thereto which is less than an aspect ratio y/x of corresponding dimensions of the object field. Such an edge contour having an aspect ratio enables the design of specular facets which can be illuminated in different impingement regions for predefining respective illumination directions that differ from one another. One and the same specular facet can therefore be illuminated in different impingement regions that differ with regard to their extent and with regard to their position on the individual specular facet, different illumination directions resulting in each case.

The specular facets can be arranged on the specular facet mirror such that no two specular facets overlap one another along the object displacement direction. Such an avoidance of an overlap results in production of the specular facet mirror being facilitated further. It has been found that even in the case where no two facets overlap one another along the object displacement direction, all relevant illumination settings can be produced with such a specular facet mirror.

A transfer facet mirror can be disposed upstream of the specular facet mirror and can include a plurality of transfer facets for the reflective guidance of the partial beams impinging on the specular facets of the downstream specular facet mirror such that object field illumination channels are predefined via the transfer facets and the downstream specular facets assigned via the reflective beam guidance, by which object field illumination channels the entire object field is in each case illuminatable with the illumination light and which object field illumination channels are assigned in each case exactly one transfer facet of the transfer facet mirror and exactly one specular facet of the downstream specular facet mirror. Such a transfer facet mirror enables a targeted selection of in each case a specific group of specular facets and thus the selection of an illumination setting to be predefined.

A local angular bandwidth of an angle of incidence of the illumination light partial beam on the respective facet can be less than 2°. Such an angular bandwidth has been found to be particularly suitable for the highly efficient reflection of EUV illumination light. This angular bandwidth is equal to half the total angular bandwidth of the illumination light partial beam on the specular facet.

An optical system can include an illumination optical unit as described herein. An object to be imaged is arrangeable in the object field. The optical system can include a projection optical unit for imaging the object field into an image field, in which a substrate is arrangeable. The advantages of such an optical system correspond to those which have already been explained above with reference to the illumination optical unit according to the disclosure.

An entrance pupil of the projection optical unit can lie in the beam path downstream of the object field. Such an entrance pupil design facilitates an optical design of the projection optical unit.

An illumination system can include an illumination optical unit as described herein. The illumination system can include an EUV light source for generating the illumination light. The advantages of such an illumination system correspond to those which have already been explained above with reference to the illumination optical unit according to the disclosure and the optical system according to the disclosure. The light source of the illumination system can be embodied as a free electron laser (FEL). The light source can have a wavelength in the region of 10 nm or less, for example of 7 nm.

The disclosure seeks to specify an illumination system for EUV projection lithography in which it is possible to produce a pupil facet mirror with reduced outlay.

In one aspect the disclosure provides an illumination system for EUV projection lithography. The illumination system includes an illumination optical unit for illuminating an illumination field with illumination light of an EUV light source. An object field of a down-stream imaging optical unit is arranged in the illumination field. An object displaceable in an object displacement direction is arrangeable in the object field. The illumination system includes a light source for generating the illumination light. The light source can be an FEL. The illumination optical unit can include a field facet mirror including a plurality of field facets for the reflective guidance of partial beams of a beam of the EUV illumination light. The illumination optical unit can further include a pupil facet mirror including a plurality of pupil facets. A location distribution of pupil facets illuminated with the illumination light predefines an illumination angle distribution of the illumination light in the object field. The field facets are imaged into the object field in a manner being superimposed on one another via the pupil facets. The pupil facets are arranged in location regions on the pupil facet mirror which are arranged in a manner spatially separated from one another by more than one pupil facet diameter from one another.

According to the disclosure, it has been recognized that it is possible to design a pupil facet mirror in which an entire facet mirror area is not occupied by pupil facets in a more or less closely packed fashion. It has been recognized that customary illumination settings can be achieved with a subset of a corresponding pre-allocation. That is to say that spatially extended location regions on the pupil facet mirror can be kept free of pupil facets. This reduces the production outlay for the pupil facet mirror. A wavelength of a light source of the illumination system can be in the region of 10 nm or less, and can be 7 nm, for example. The pupil facet mirror can be the last mirror in the beam path of the illumination light for guiding the illumination light upstream of the object field. A beam shaping device can in turn be arranged in the beam path of the illumination light upstream of the field facet mirror. The explanations already given above with regard to the beam shaping device are applicable here.

At least one of the location regions is arranged as a ring on the pupil facet mirror. This has been found to be particularly suitable for producing typical illumination settings. One of the location regions can be arranged centrally on the pupil facet mirror. The central location region in which the pupil facets are arranged is then at a distance from a neighboring location region in which pupil facets are likewise arranged, which distance is greater than the diameter of a pupil facet and can in particular also be greater than the diameter of the entire central location region. In the case of a ring-shaped location region, the distance between this ring-shaped location region in which pupil facets are arranged and a neighboring location region can be greater than a radial ring thickness of the ring-shaped location region. At least one ring-shaped location region can be arranged at the outer edge of the pupil facet mirror. At least one ring-shaped location region can also be arranged between an outer edge and a central region of the pupil facet mirror.

The illumination system can comprise a field facet mirror having fewer than twenty field facets, for example a field facet mirror having twelve or else having eight field facets.

The illumination optical unit, the optical system or the illumination system can comprise a pupil facet mirror having fewer than one hundred pupil facets, for example having fewer than eighty pupil facets, having seventy-two pupil facets, having fewer than seventy pupil facets, having fewer than sixty pupil facets, having fewer than fifty pupil facets and for example having forty-eight pupil facets. An even smaller number of pupil facets is also possible.

The advantages of a projection exposure apparatus including an illumination system described herein and a projection optical unit, of a production method using such a projection exposure apparatus, and of a micro- or nanostructured component made by such a method, correspond to those which have already been explained above with reference to the illumination optical unit according to the disclosure and with reference to the illumination system according to the disclosure and the optical system according to the disclosure.

BRIEF DESCRIPTION OF THE DRAWINGS

Exemplary embodiments of the disclosure are explained in greater detail below with reference to the drawings, in which.

DETAILED DESCRIPTION

Figure 1:
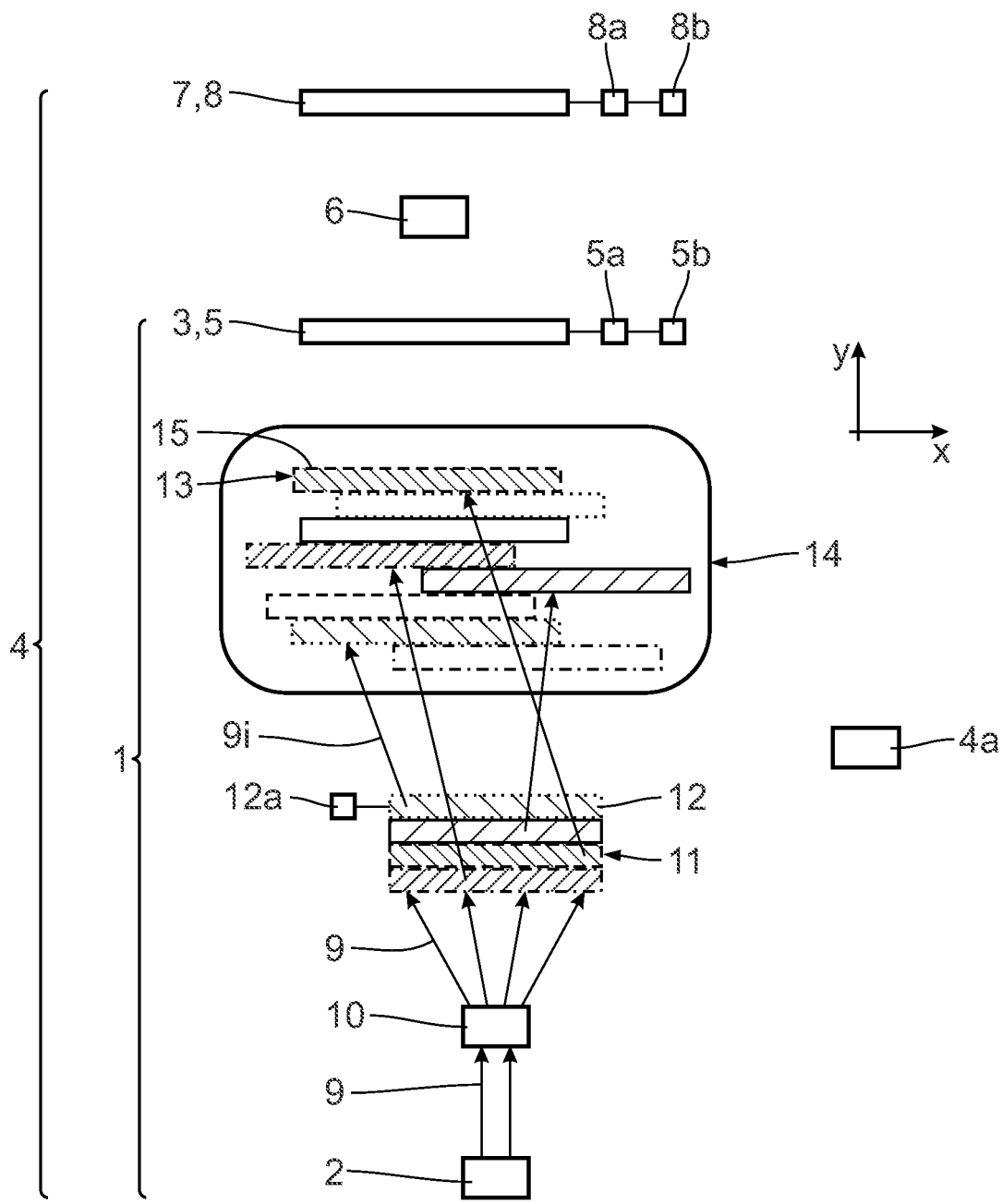
FIG. 1 shows highly schematically an EUV illumination system of an EUV projection exposure apparatus comprising a specular reflector.

An EUV illumination system 1 is illustrated schematically in FIG. 1 between an EUV radiation source 2 and an illumination field or object field 3. The EUV illumination system 1 is part of an EUV projection exposure apparatus 4 for producing highly integrated semiconductor components, in particular memory chips comprising structures in the nanometers range.

The illumination system 1 serves for the defined illumination of an illumination field. The illumination field can be larger than the actual object field 3, such that the object field 3 is arranged in the illumination field. Alternatively, the illumination field can coincide with the object field 3. In a further variant, the illumination field can be smaller than the object field 3 along an object or reticle displacement direction. The illumination field can be larger than the object field 3 perpendicular to the object displacement direction.

Figure 2:
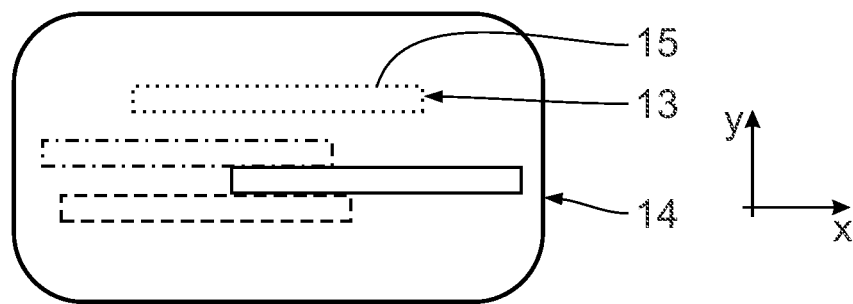
FIG. 2 shows highly schematically an embodiment of specular facets of the specular reflector having continuous static reflection surfaces, only some of the specular facets being illustrated.

In the embodiment according to FIG. 1, the radiation source according to FIG. 2 is a free electron laser (FEL).

The object field 3 is rectangular. Alternatively, the object field 3 can also be embodied in a ring-shaped fashion or in an arcuate fashion.

A reflective reticle 5, also designated as a lithography mask, is arranged in the object field 3. The reticle 5 is carried by a reticle holder 5a, which in turn is mechanically operatively connected to a reticle displacement device 5b.

The object field 3 is imaged into an image field 7 via a projection lens 6. An entrance pupil of the projection optical unit 6 can be situated in the beam path downstream of the object field 3. A section of a wafer 8 which bears a layer that is light-sensitive to EUV illumination light 9 generated by the radiation source 2 is arranged in the image field 7. The wafer 8 is also designated as a substrate. The wafer 8 is carried by a wafer holder 8a, which in turn is mechanically connected to a wafer displacement device 8b.

The EUV projection exposure apparatus 4 has a central control device 4a and is embodied in the manner of a scanner. In this case, a scanning direction runs parallel to short sides of the object field 3 and of the illumination field 7.

The components of the projection exposure apparatus 4 are all illustrated schematically in a plan view in FIG. 1.

In this plan view, the object field 3 and the image field 7 are spanned by the coordinates x, y of a Cartesian coordinate system. The x-direction runs toward the right in FIG. 1. The y-direction runs upward in FIG. 1. An actual principal beam direction of the illumination light 9 runs substantially perpendicular to the xy-plane in the projection exposure apparatus 4.

The illumination light 9 emitted by the radiation source 2 is firstly shaped by a beam shaping device 10. This can involve an xy-scanner which fans out the illumination beam, emitted with low divergence by the radiation source 2, both in the x-direction and in the y-direction. The beam shaping device 10 makes it possible to select individually what effective x-extent and what effective y-extent a beam of the illumination light 9 has down-stream of the beam shaping device 10. A driving of the beam shaping device 10 can be chosen such that one of the optical elements that follow in the beam path of the illumination light 9, in particular the next optical element in the beam path, and/or the object field 5 or/is illuminated homogeneously by the illumination light 9.

In an alternative embodiment, the beam shaping device 10 comprises at least one stationary mirror that fans out the illumination light 9. The fan-out can be chosen such that one of the optical elements that follow in the beam path of the illumination light 9, in particular the next optical element in the beam path, and/or the object field 5 are/is illuminated homogeneously by the illumination light 9.

Insofar as the beam shaping device 10 is embodied as an xy-scanner, this embodiment can be such that only a small region of one of the optical components that succeed the beam shaping device 10 in the beam path of the illumination light 9 is illuminated at a point in time. As a result, when a highly coherent light source is used, in particular when an FEL is used, speckle can be reduced.

The illumination light 9 has a wavelength in the range of between 5 nm and 30 nm, in particular a wavelength of at most 10 nm, for example of 7 nm.

A transfer facet mirror 11 comprising transfer facets 12 is disposed downstream of the beam shaping device 10 in the beam path of the illumination light 9. The transfer facets 12 are individually switchable via tilting actuators 12a, of which one tilting actuator 12a is illustrated by way of example in FIG. 1, and can be individually tilted in a defined manner about tilting axes parallel to the x-axis and parallel to the y-axis. The transfer facets 12 are rectangular. A boundary shape of the object field 3 need not correspond to a boundary shape of the transfer facets 12. An x/y aspect ratio of the transfer facets 12 need not correspond to an x/y aspect ratio of the object field 3.

Illumination light partial beams 9i which are reflected by a respective one of the transfer facets 12 impinge on specular facets 13 of a specular facet mirror 14, which is arranged in the beam path of the illumination light 9 downstream of the transfer facet mirror 11. The specular facet mirror 14 constitutes a specular reflector of the illumination system 1. The transfer facet mirror 11 and the specular facet mirror 14 are parts of an illumination optical unit of the illumination system 1 for illuminating the object field or illumination field 3. The illumination optical unit and the projection optical unit 6 are parts of an optical system of the projection exposure apparatus 4.

The specular facets 13 are arranged alongside one another in an xy-arrangement plane of the specular facet mirror 14. The specular facets 13 serve for the reflective, superimposing guidance of the partial beams 9i of the entire beam of the illumination light 9 toward the object field 3. Illumination channels are in each case predefined via the transfer facets 12 and the downstream specular facets 13 assigned via the reflective beam guidance of the illumination partial beams 9i. Via the illumination channels, the entire object field 3 is in each case illuminatable with the illumination light 9. A respective one of the object field illumination channels is assigned in each case exactly one transfer facet 12 and in each case exactly one specular facet 13. Alternatively, a respective one of the transfer facets can also be assigned to a plurality of illumination channels and thus to a plurality of specular facets 13.

As is known from the literature concerning the specular reflector, for example from DE 103 17 667 A1 or U.S. Pat. No. 2010/0231882 A1, the specular facet mirror 14 is arranged such that a position of the respective specular facet 13 on the specular facet mirror 14 and an impingement location of the illumination light partial beam 9i on the respective specular facet 13 of the specular facet mirror 14 predefine an illumination direction for field points of the object field 3.

At the same time, an edge contour of an impingement region, that is to say—in the case of the entire impingement on a specular facet 13—the edge contour of the specular facet 13 itself, of the illumination light partial beam 9i on the respective specular facet 13 of the specular facet mirror 14 predefines a field shape of the object field 3. The contour configuration and also the arrangement of the specular facets 13 on the specular facet mirror 14 therefore include both the information "illumination angle" and the information "field shape" with respect to the illumination of the object field 3.

Each of the specular facets 13 has a continuous static reflection surface 15. Unlike in the above-cited publications concerning the specular reflector, the specular facets 13, for their part, are not subdivided into a plurality of individual mirrors, but rather in each case constitute a single, monolithic mirror.

The specular facet mirror 14 is arranged neither in a pupil of the projection exposure apparatus 4 nor in a field plane of the projection exposure apparatus 4.

The specular facets 13 are impinged on with angles of incidence having a small angular bandwidth. The angular bandwidth can be less than 2°. The angular bandwidth is equal to half a total angular bandwidth of angles of incidence which the illumination light partial beam 9i has on the respective specular facet 13. If, by way of example, an illumination light partial beam 9i impinges on one of the specular facets 13 with angles of incidence of between 3° and 7°, the total angular bandwidth is 4° and the angular bandwidth on the specular facet 13 is then 2°.

The angular bandwidth of the angles of incidence on the specular facets 13 can relate to local angles of incidence. A largest angle of incidence and a smallest angle of incidence of the illumination light 9 are then determined for each location on a respective one of the specular facets 13. If illumination light partial beams 9i with an angle of incidence of between 2° and 4° impinge at a location on one of the specular facets 13 and illumination light partial beams 9i with an angle of incidence of between 10° and 12° impinge at another location on the same specular facet 13, then a local total angular bandwidth on this specular facet 13 is 2° and the local angular bandwidth is then 1°. These local bandwidth values make no statement about the magnitude of the angular bandwidth at other locations not taken into consideration on the specular facet 13. If some other angular bandwidth on the specular facet is significantly greater than a local angular bandwidth present at specific locations of this specular facet, then properties of a highly reflective coating of this specular facet 13 can be chosen in a manner dependent on the location on the specular facet 13. In this case, it is possible to achieve a reflectivity of the specular facet which is dependent on the local angular bandwidth and not on an angular bandwidth determined over the entire specular facet 13.

In the case of the embodiment of the illumination system 1 according to FIG. 1, the specular facet mirror 14 is the last optical component that guides the illumination light 9 in the illumination system 1 upstream of the object field 3. In the case of other embodiments (not illustrated) of the illumination system 1, a grazing incidence mirror is situated between the specular facet mirror 14 and the object field in the beam path of the illumination light 9. The grazing incidence mirror can be embodied as a plane mirror without refractive power, but alternatively also as a convexly or concavely curved mirror.

FIG. 1 shows, via a corresponding hatching coding, an assignment of the transfer facets 12 of the transfer facet mirror 11 to the specular facets 13 of the specular facet mirror 14 that are illuminated by the respective transfer facets 12 via the illumination partial beams 9i. Since four transfer facets 12 are illustrated by way of example in FIG. 1, four of the total of eight specular facets 13 illustrated in FIG. 1 are hatched in the same way as the transfer facets 12 illuminating them. The other specular facets 13 are either unilluminated or illuminated by other transfer facets 12 (not illustrated).

In actual fact, the number of transfer facets 12 and the number of specular facets 13 are very much higher than in the schematic illustration according to FIG. 1. A picture of the actual number of specular facets is given by FIG. 7, which is also explained below.

FIG. 2 shows one variant of an edge contour shaping of the specular facets 13 of the specular facet mirror 14. In the case of the embodiment according to FIG. 2, the specular facets 13 are in each case shaped such that, upon complete impingement, via their respective rectangular edge contour and the shape of their respective reflection surface 15, they predefine both the illumination direction for each field point and the field shape for the object field 3.

Figure 4:
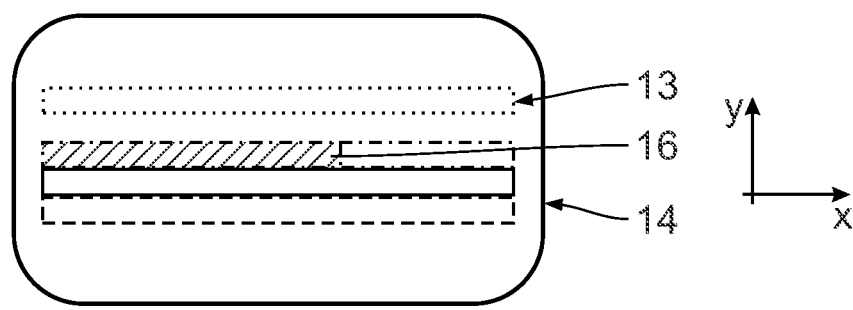
FIG. 4 shows, in an illustration similar to FIG. 2, a further embodiment of an arrangement of continuous static reflection surfaces of specular facets of a specular reflector which can be used in the illumination system according to FIG. 1.

An alternative shaping of the specular facets 13 is shown in FIG. 4. There the specular facets 13 are embodied with in each case an identical extent in the x-direction, that is to say along the long field dimension of the fields 3 and 7. In the case of the embodiment according to FIG. 4, the various specular facets 13 are arranged alongside one another in the y-direction without an x-offset. For predefining firstly the illumination direction for each field point and secondly the field shape for the object field 3, the specular facets 13 in the case of the embodiment according to FIG. 4 are impinged on with the illumination light partial beams 9i in different impingement regions. One such impingement region 16 is highlighted in a hatched manner in FIG. 4. The impingement region 16 is smaller than the specular facet 13 impinged on. In the case of the example illustrated in FIG. 4, the impingement region 16 has a smaller x-extent than the entire associated specular facet 13.

A y/x aspect ratio of the specular facets 13, that is to say a ratio of short side length/long side length of the specular facets 13, can be less than a corresponding y/x aspect ratio of the object field 3.

The specular facets 13 are arranged on the specular facet mirror 14 such that no two specular facets 13 overlap one another along the y-dimension, that is to say along the dimension corresponding to the scanning direction or the object displacement direction. All the specular facets 13 are therefore lined up alongside one another along the y-direction. In each case at most exactly one specular facet 13 is present at an arbitrary y-coordinate.

Figure 3:
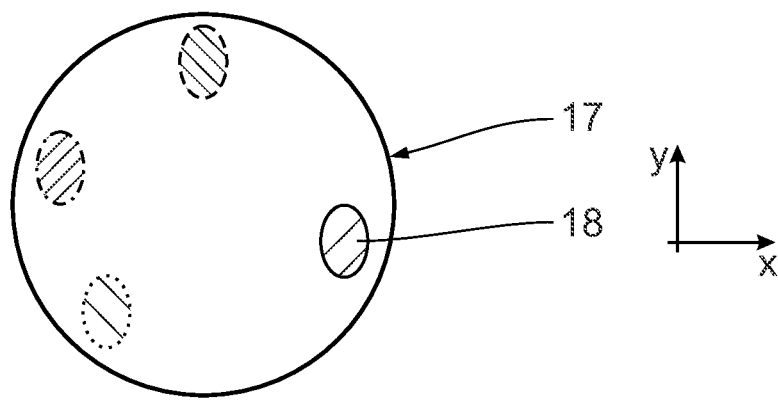
FIG. 3 shows an intensity distribution in a pupil in a pupil plane of the illumination system according to FIG. 1, wherein EUV illumination light impinges on some specular facets of the specular reflector according to FIG. 2.

FIG. 3 schematically shows an intensity distribution of the illumination light 9 in a pupil 17 of the illumination system 1. A hatching corresponding to that according to FIG. 1 again indicates which pupil spot 18 is illuminated with the respective illumination light partial beam 9i via which of the specular facets 13. The extent of the pupil spots 18 is illustrated in a greatly exaggerated manner in FIG. 3.

FIG. 3 does not show an intensity distribution of an illumination light impingement on a for example reflective optical component, but rather shows an intensity distribution during the passage of a total of four illumination light partial beams at the location of the pupil spots 18 through a pupil plane in which the pupil 17 is arranged. The pupil spots 18 have a greater extent parallel to the scanning direction y than perpendicular thereto, that is to say than in the x-direction. The pupil spots 18 have an elliptical cross section.

In the case of a pupil spot distribution according to FIG. 3, the entire object field 3 would be illuminated from four different directions corresponding to the position of the four pupil spots 18 in the pupil 17 according to FIG. 3. The position of the four pupil spots 18 corresponds to the position of the respective specular facets 13 or the position of the impingement regions 16 on the respective specular facets 13.

The central control device 4a is signal-connected to components of the projection exposure apparatus 4 that are to be controlled, for example to the radiation source 2, to the beam shaping device 10, to tilting actuators 12a for the transfer facets 12 and to the displacement devices 5b and 8b. Via the control device 4a it is possible to predefine an illumination setting, that is to say one of various possible distributions of pupil spots 18 on the pupil 17. Furthermore, the control device 4a predefines a synchronized displacement of the reticle 5 and of the wafer 8 during the scanning projection exposure, in each case along the y-direction.

Figure 5:
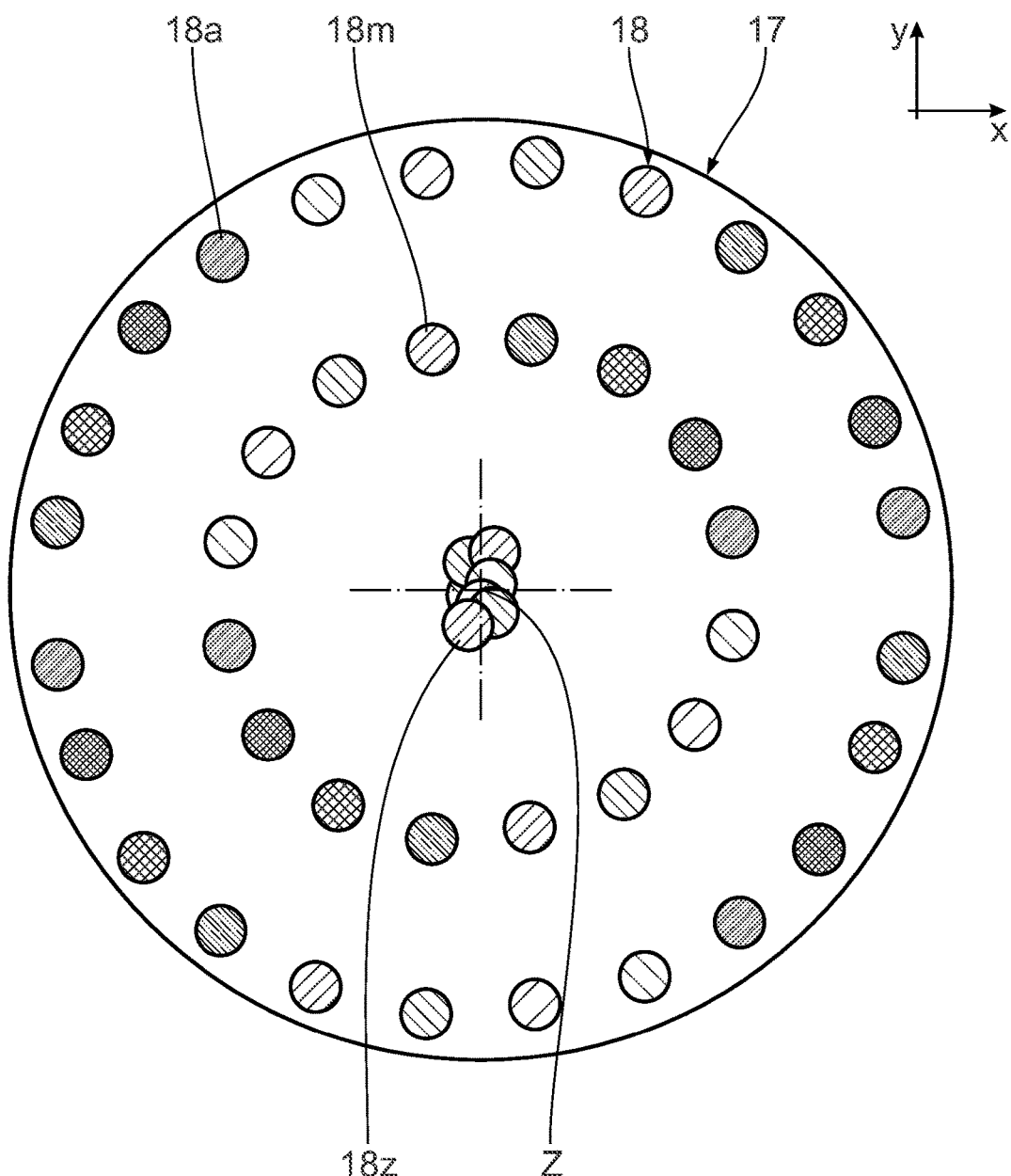
FIG. 5 shows, in an illustration similar to FIG. 3, an intensity distribution in a pupil of the illumination system, generated by a specular reflector having a multiplicity of specular facets which are arranged in the manner according to FIG. 2 or 4, the pupil spots being illustrated with an exaggerated size in comparison with the size of the entire pupil.

FIG. 5 shows an overall arrangement of pupil spots 18 in the pupil 17. For clarification it should be pointed out again that no physical optical component of the illumination system 1 is arranged in the pupil 17. The illustrations according to FIGS. 3 and 5 illustrate intensity distributions of the illumination light in a plane of the pupil 17, that is to say in a pupil plane. The pupil spots 18 are illustrated in a greatly enlarged manner in FIG. 5. In actual fact, on account of the small angular bandwidth, that is to say the small divergence, of the radiation emitted by the FEL 2, the pupil spots 18, which can also be regarded as light source images, in relation to the extent of the entire pupil 17, are very much smaller than illustrated in FIG. 5.

On account of the enlarged illustration, it cannot be gathered from the overall arrangement of the pupil spots 18 according to FIG. 5 that the individual pupil spots 18 all have different y coordinates.

While FIG. 3 shows an intensity distribution of illumination light partial beams 9i which pass through a pupil plane and which illuminate a region of the object field 3 that is extended in the scanning direction y, FIG. 5 shows an intensity distribution of illumination light partial beams 9i which illuminate only in each case a very small region of the object field 3. This small illuminated object field region includes, in particular, a center of the object field 3, measured along the scanning direction y. Accordingly, the pupil spots 18 in FIG. 3 have a greater extent parallel to the scanning direction y than the pupil spots 18 in FIG. 5.

FIG. 5 shows an arrangement of a total of forty-eight pupil spots 18. Eight of the pupil spots 18*z* are arranged closely adjacently to one another near a center Z of the pupil 17. Sixteen of the pupil spots 18*m* are arranged in a central radius region between the center Z and an edge region of the pupil 17. A further twenty-four of the pupil spots 18*a* are arranged in an outer radius region near the edge of the pupil 17. In this case, the pupil spots 18*m* in the central radius region are arranged approximately at half the distance between the center Z and the outer edge of the pupil 17.

Figure 6:
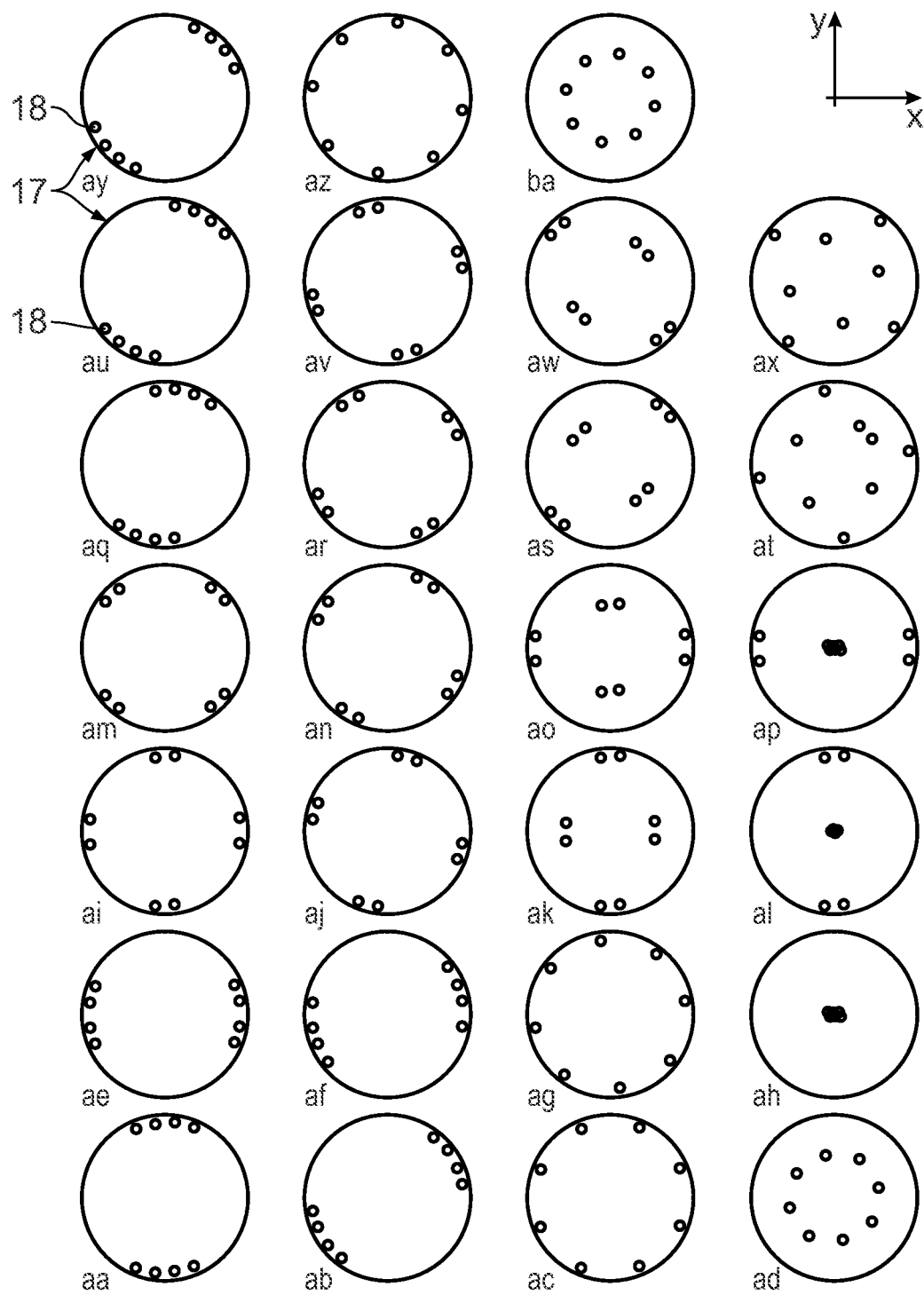
FIG. 6 shows illumination examples aa, ab . . . az, ba of the pupil according to FIG. 5, in each case eight pupil spots being illuminated, the pupil spots being illustrated with an exaggerated size in comparison with the size of the entire pupil.

FIG. 6 shows a total of twenty-seven different arrangements of in each case eight pupil spots 18 which can be selected from the overall arrangement of the pupil spots 18 according to FIG. 5. These different arrangements aa, ab, . . . az and ba according to FIG. 6 constitute different illumination settings of the illumination system 1 and can be illuminated in each case via object field illumination channels by illumination light partial beams 9*i* which are reflected from a transfer facet mirror 11 having eight transfer facets 12 to the specular facets 13 of the specular facet mirror 14 that correspond to the respectively selected pupil spots 18. The different pupil spot arrangements according to FIG. 6 can therefore be produced by one and the same transfer facet mirror 11 having eight transfer facets 12 which are correspondingly tilted in each case for the selection of the predefined arrangement of the pupil spots 18, such that those specular facets 13 are illuminated which in turn reflect the illumination light 9 toward the predefined pupil spots 18. The specular facets 13 need not be tiltable or displaceable in some other way for this purpose. It is therefore possible to manufacture the specular facet mirror 14 monolithically in its entirety.

The different illumination settings according to FIG. 6 include dipole illumination settings having different dipole alignments, for example the illumination settings 6*aa*, 6*ab*, 6*ae* and 6*af*, annular illumination settings having different absolute illumination angles, for example the illumination settings 6*ac*, 6*ad*, 6*g*, quadrupole illumination settings having different absolute illumination angles and different pole alignments, for example the illumination settings 6*ai*, 6*aj*, 6*ak*, 6*am*, 6*an*, 6*ao*, and further illumination settings, in particular quadrupole illumination settings in which regions oriented in a manner offset with respect to one another in each case by 90° in a circumferential direction around a center of the pupil have different absolute illumination angles, and in some instances exotic illumination settings.

Figure 7:
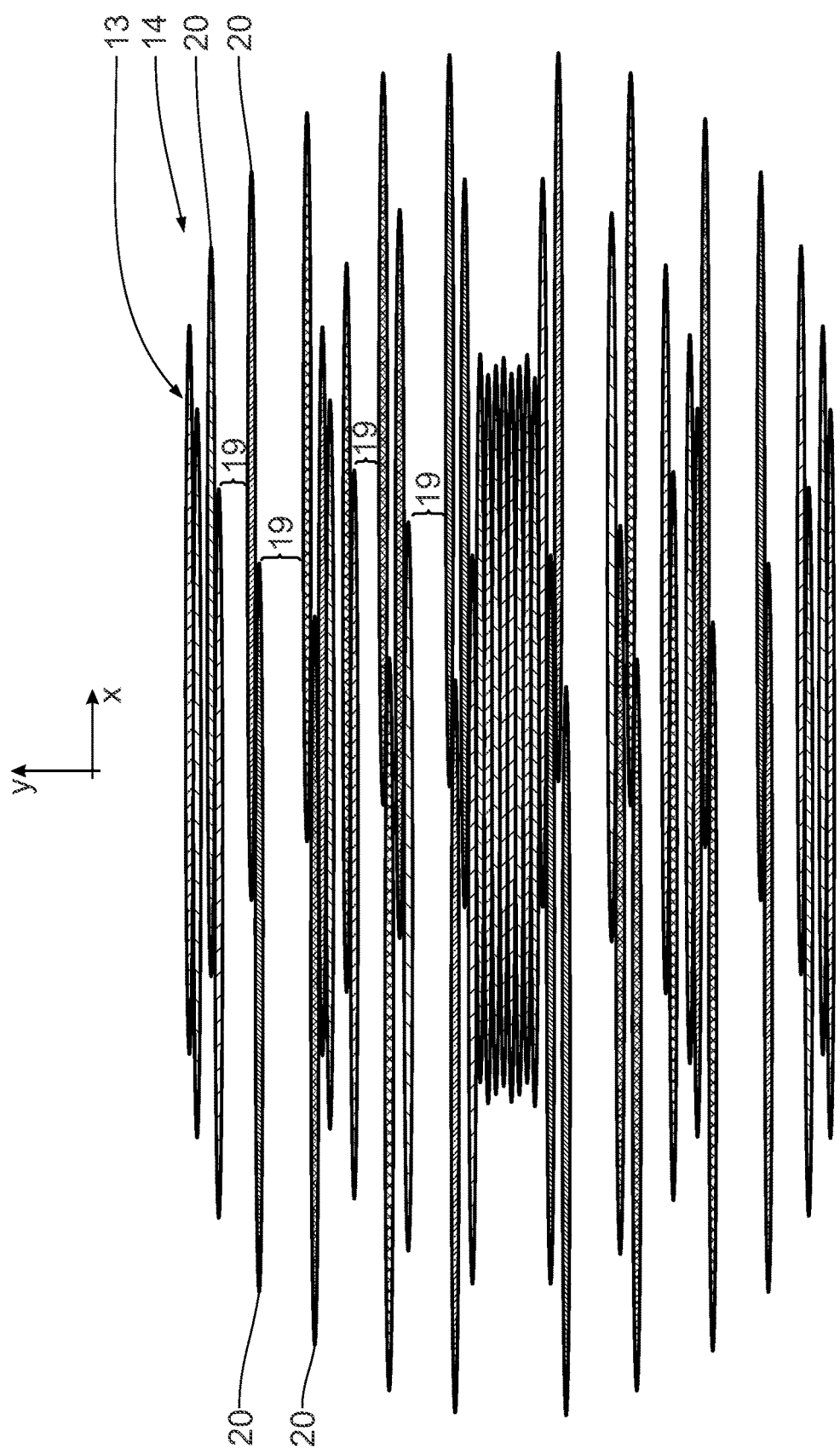
FIG. 7 shows an arrangement of facets of the specular reflector for illuminating pupil spot arrangements according to FIGS. 5 and 6.

The specular facet mirror 14 associated with the arrangement of the pupil spots 18 according to FIG. 5 has forty-eight specular facets 13 and is illustrated in FIG. 7. The arrangement of the specular facets 13 of the specular facet mirror 14 according to FIG. 7 can be understood as folding of the overall pupil spot arrangement according to FIG. 5 with the object field 3. Since the edge contour at any rate of the impingement regions on the specular facets 13 can be understood as folding of the round pupil spots 18 with the rectangular object field 3, the individual impingement regions or else the specular facets 13 themselves have edge regions 20 trailing off in a curved fashion elliptically rather than angularly in the positive and negative x-direction. Particularly when an FEL is used as the light source, the pupil spots 18 can be so small that the illustrated rounding of the edge regions 20 can be disregarded.

The individual specular facets 13 of the specular facet mirror 14 according to FIG. 7 are not arranged alongside one another without gaps in the y-direction, but rather only where pupil spots 18 are actually arranged along the corresponding y-coordinate of the pupil 17 according to FIG. 5. In other words, a plurality of gap regions 19 can be found between clusters of specular facets 13 on the specular facet mirror 14. The gap regions 19 have in the y-direction an extent corresponding to a multiple of the y-extent of the individual specular facets 13.

The predefinition of an illumination angle distribution, that is to say of a distribution of illumination directions, on the object field 3 corresponds to the predefinition of an illumination pupil, that is to say an intensity distribution in the pupil 17. The predefinition of an illumination angle distribution along a line running substantially perpendicular to the scanning direction y, that is to say in the x-direction, in the object field 3 predefines an illumination angle distribution on an associated specular facet 13 along a line likewise running substantially perpendicular to the scanning direction y. For a given shape and position of a transfer facet 12 assigned to the specular facet 13, this results in a surface shape of the specular facet 13 along the line perpendicular to the scanning direction y. In other words, along a line running substantially perpendicular to the scanning direction y, the intensity distribution of the illumination light 9 in the pupil 17 can be predefined freely in wide ranges. Such a free predefinition of the intensity distribution in the pupil 17 is possible, in particular, if the predefinition line runs perpendicular to the scanning direction y and the pupil spots 18 in the pupil 17 cannot overlap one another along the scanning direction y. For different specular facets 13, it is possible to predefine illumination spots 18 in the pupil 17 which correspond to a total achievable distribution of the illumination spots 18 in the pupil 17 according to FIG. 5.

In order to avoid overlap effects in the edge region of the object field 3, the specular facets 13, in particular in terms of their extent parallel to the scanning direction y, can be embodied with a smaller extent than would be involved for predefining the illumination angle distribution. A slight dependence of an illumination angle distribution on the object field 3 on the location on the object field 3, in particular a dependence of the illumination angle distribution on the y-coordinate, can be tolerated in this case.

A further embodiment of a projection exposure apparatus 21 which can be used instead of the projection exposure apparatus 1 for producing a micro- or nanostructured semiconductor component is explained below with reference to FIG. 8. Components corresponding to those which have already been explained above with reference to the projection exposure apparatus 1 and the components thereof according to FIGS. 1 to 7 bear the same reference numerals and will not be discussed in detail again.

Figure 8:
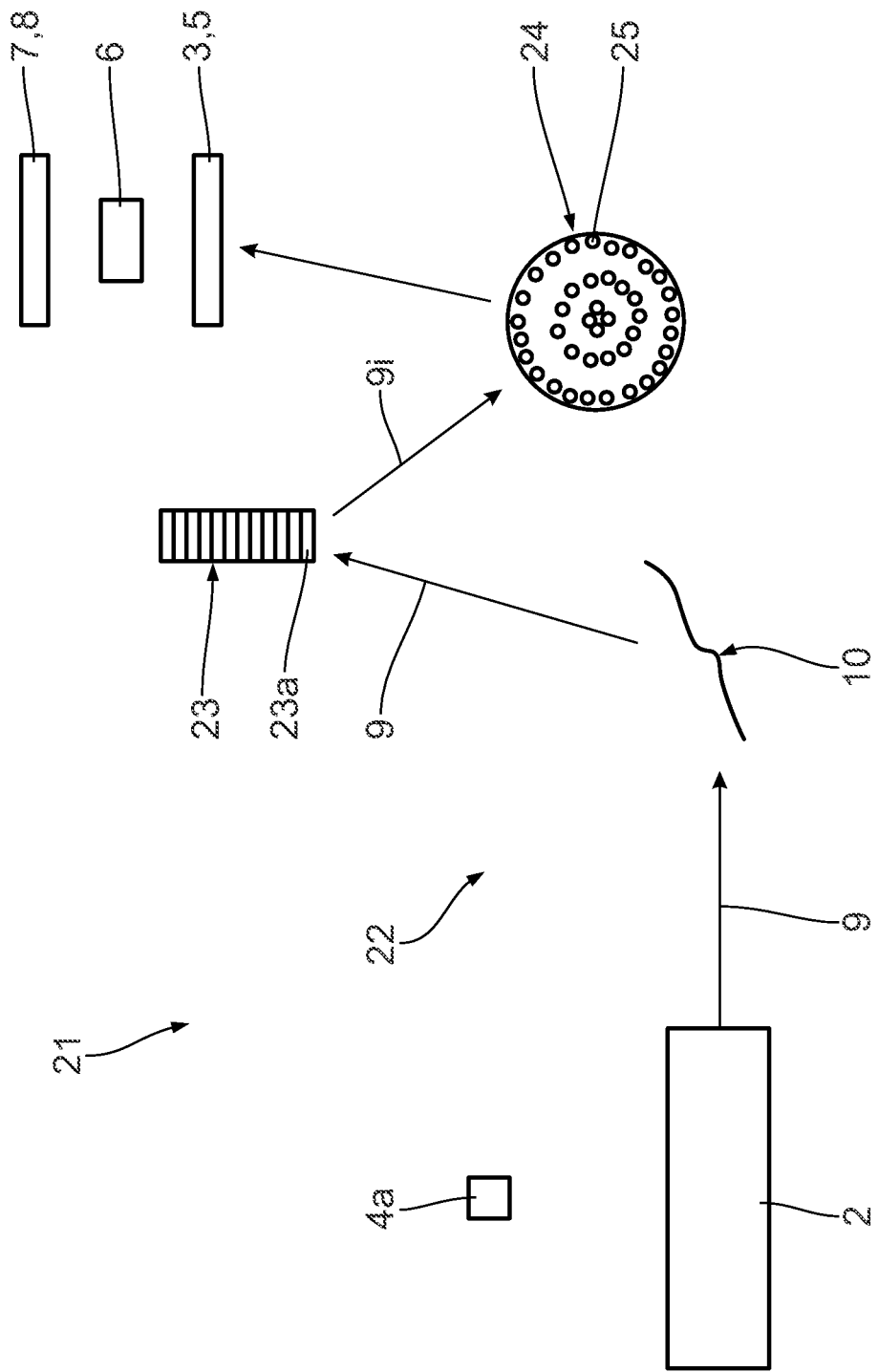
FIG. 8 likewise shows highly schematically a further embodiment of an EUV illumination system of an EUV projection exposure apparatus comprising a field facet mirror and a pupil facet mirror.

As indicated in the case of the exemplary embodiment according to FIG. 8, the beam shaping device 10 can have a reflection mirror. A beam shaping surface of the beam shaping device 10, in particular the reflection mirror, can be embodied as a freeform surface.

An illumination system 22 of the projection exposure apparatus 21 which can be used instead of the illumination system 1 has a field facet mirror 23 and a pupil facet mirror 24.

The field facet mirror 23 has a plurality of field facets 23*a* which are imaged into the object field 3 in a manner being superimposed on one another.

The pupil facet mirror 24, which is arranged in the region of a pupil plane of the projection exposure apparatus 21, has a plurality of pupil facets 25. The latter are arranged at the location of possible pupil spots which arise as images of the radiation source 2 along corresponding object field illumination channels which can be formed via a corresponding tilting adjustment of the field facets 24. A location distribution of pupil facets 25 illuminated in each case with an illumination light partial beam 9i predefines an illumination angle distribution of the illumination light 9 in the object field 3. In contrast to the illumination system 1 according to FIG. 1, in the case of the illumination system 21 according to FIG. 8, a reflective optical component, namely the pupil facet mirror 24, is arranged in the pupil plane.

The superimposing imaging of the field facets 23a in the object field 3 is carried out via the pupil facets 25.

The pupil facets 25 are arranged in different location regions 26, 27, 28 on the pupil facet mirror 24 which are arranged in a manner spatially separated from one another by more than one pupil facet diameter d from one another. This is explained in greater detail below with reference to FIG. 9.

Figure 9:
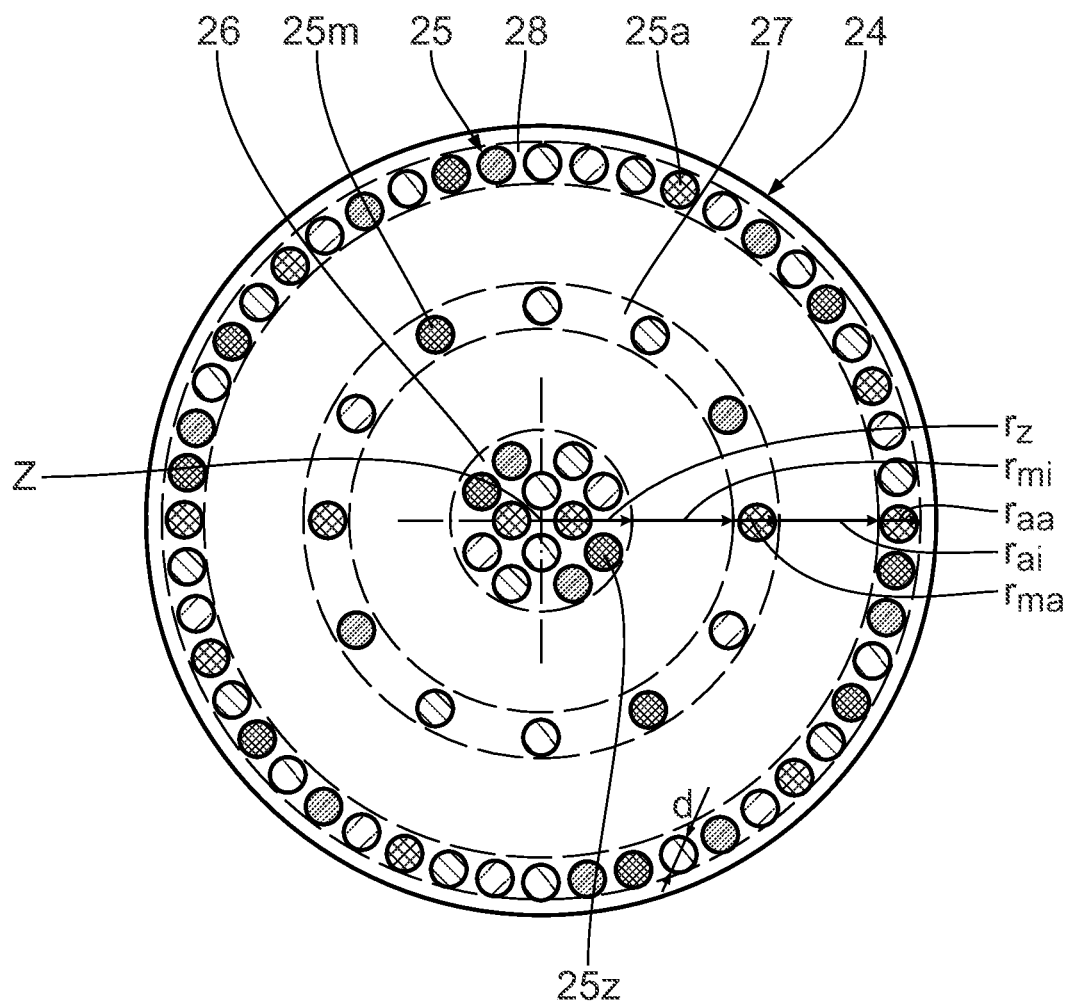
FIG. 9 shows an embodiment of a pupil facet mirror for use in the EUV illumination system according to FIG. 8 with an arrangement of pupil facets, suitable for illumination with twelve field facets of the field facet mirror, the pupil facets being illustrated with an exaggerated size in comparison with the size of the entire pupil facet mirror.

The pupil facet mirror 24 according to FIG. 9 has a total of seventy-two pupil facets 25. Twelve inner pupil facets 25z are arranged in the central location region 26 of the pupil facet mirror 24. The central location region 26 extends in the radii region $[0; r_z]$ around the center Z of the pupil facet mirror 24. Twelve further pupil facets 25m are arranged in the central, ring-shaped location region 27 on the pupil facet mirror 24. The central location region 27 extends between the radii $r_{mi}$ and $r_{ma}$, in the region $[r_{mi}; r_{ma}]$. A further forty-eight pupil facets 25a are arranged in the likewise ring-shaped outer location region 28, which extends in the radii region $[r_{ai}; r_{aa}]$ around the center Z of the pupil facet mirror 24.

The central pupil facets 25m are arranged on the pupil facet mirror 24 in the location region 27 in a manner spaced apart identically in the circumferential direction.

The outer pupil facets 25a are arranged on the pupil facet mirror 24 in the location region 28 in a manner spaced apart identically in the circumferential direction.

It holds true that:

$d < r_{mi} - r_z$ and $d < r_{ai} - r_{ma}$.

Therefore, the location regions 26 to 28 are arranged in a manner spatially separated from one another by more than one pupil facet diameter d from one another.

In principle, for the distances $r_{mi} - r_z$ and $r_{ai} - r_{ma}$, it can hold true that these radii distances are greater than the diameter of the central location region 26.

The ring thicknesses $r_{ma} - r_{mi}$ on the one hand and $r_{aa} - r_{ai}$ on the other hand are smaller than the radial distances between neighboring location regions 26, 27 and respectively 27, 28.

Figure 10:
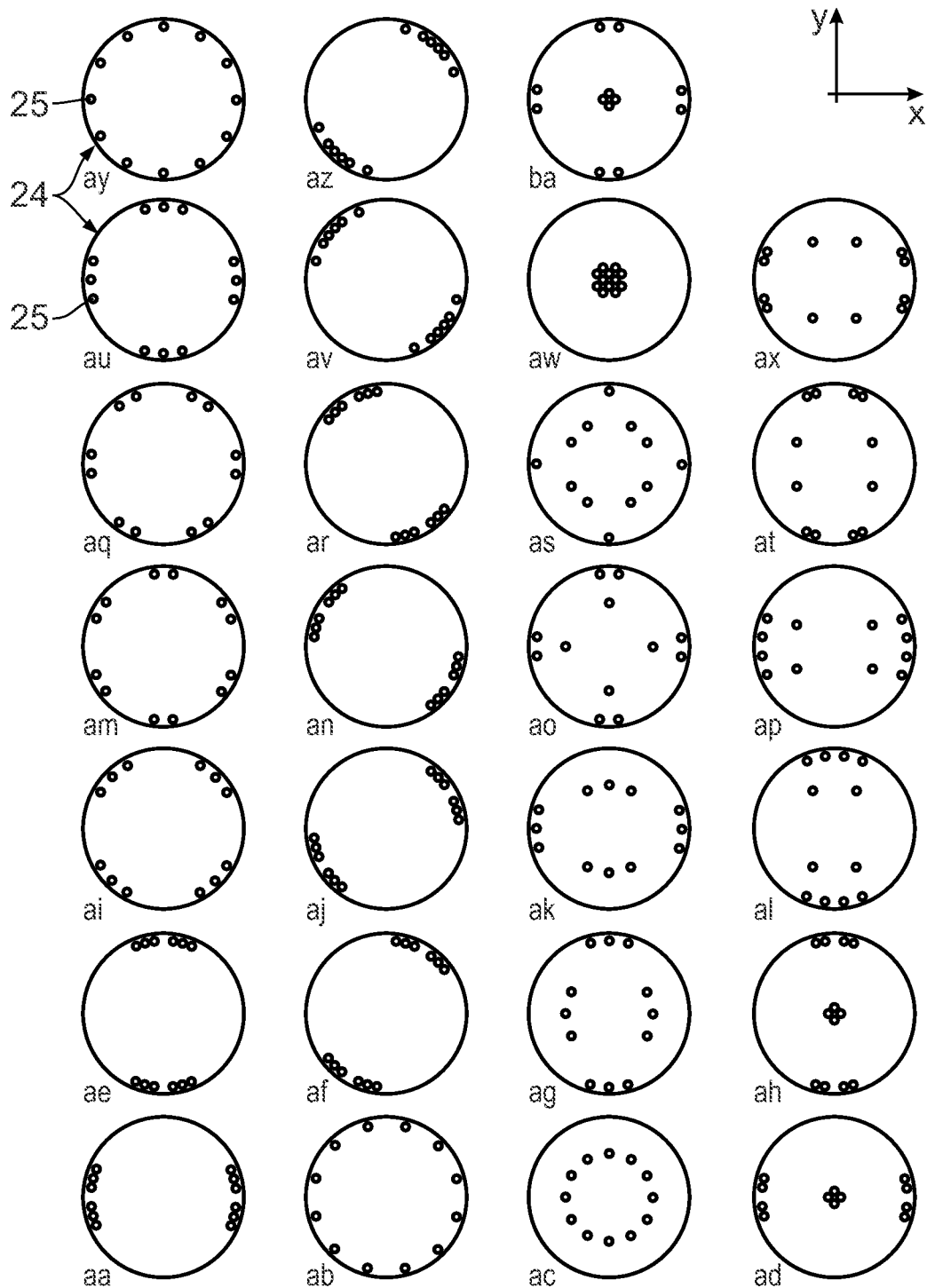
FIG. 10 shows illumination examples aa, ab . . . az, ba of the pupil facet mirror according to FIG. 9, in each case twelve pupil facets being illuminated, the pupil facets being illustrated with an exaggerated size in comparison with the size of the entire pupil.

With an illumination system 22 comprising a field facet mirror corresponding to the field facet mirror 23 having a total of twelve field facets 23a, arrangements of illuminated pupil facets 25, that is to say illumination settings, shown by way of example in FIG. 10, can be set with a pupil facet mirror 24 having an overall pupil facet arrangement according to FIG. 9. Overall, FIG. 10 shows twenty-seven different illumination settings aa, ab, ac . . . az and ba. The hatching in FIG. 9 indicates which pupil facets 25 are assigned to which field facet 23a. The same hatching is assigned to in each case two of the field facets 23a since these two field facets 23a illuminate two pupil facets 25 arranged point-symmetrically on the pupil facet mirror 24.

FIG. 10 shows, in principle in a manner comparable to FIG. 6, once again different types of illumination settings that are all settable with the overall pupil facet arrangement according to FIG. 9, namely in particular dipole illumination settings, annular illumination settings, multipole illumination settings, quadrupole illumination settings and quadrupole illumination settings having different radial extents of poles rotated by 90° with respect to one another about the center Z. These types of illumination settings suffice to be able to image all relevant structure types on the reticle 5 onto the wafer 8 with good quality. Despite the small number of field facets 23a and of pupil facets 25, it is possible to set all these illumination settings without this necessitating a displaceable configuration of the pupil facets 25. In each case exactly two pupil facets 25 which are illuminated with the illumination settings according to FIG. 10 are pupil facets 25 having identical hatching in FIG. 9.

Figure 11:
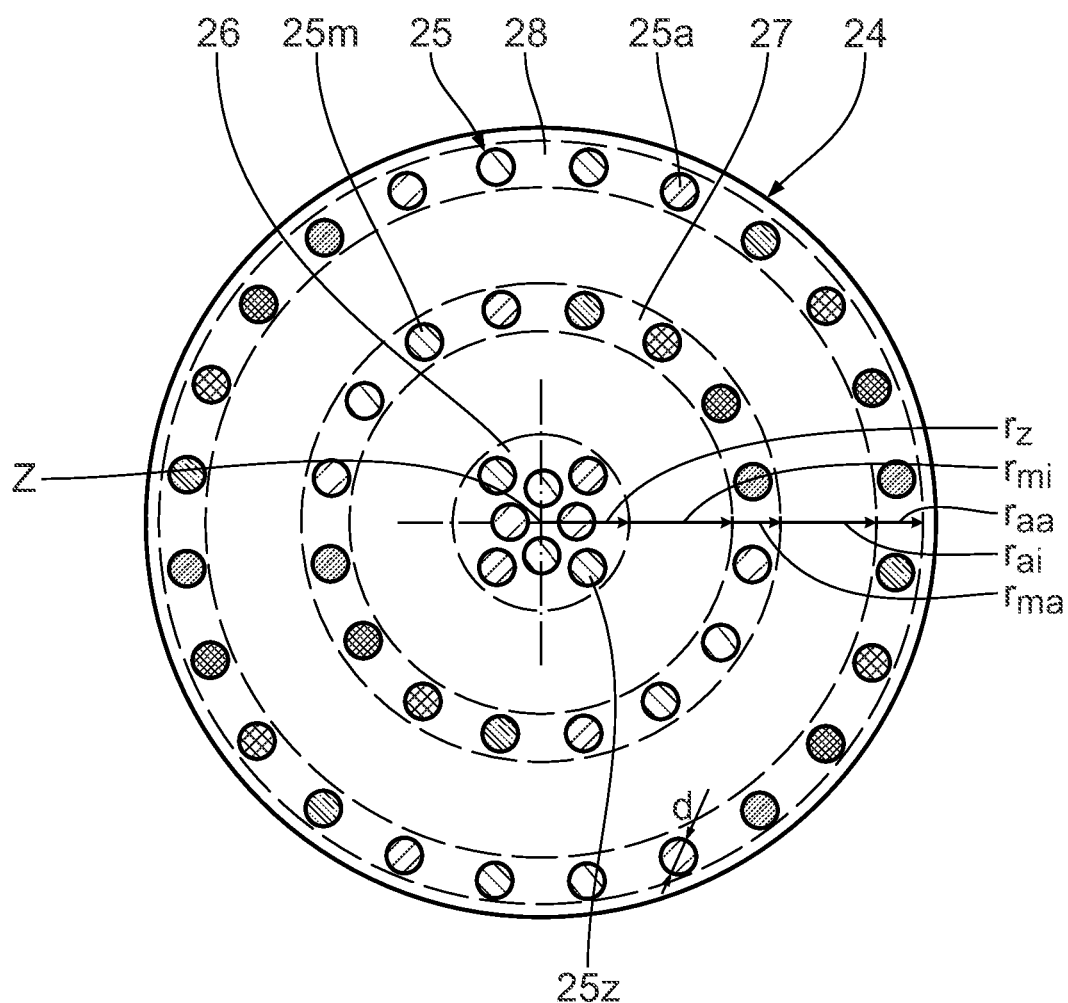
FIG. 11 shows a further embodiment of a pupil facet mirror for use in the EUV illumination system according to FIG. 8 with a further arrangement of pupil facets, suitable for illumination with eight field facets of the field facet mirror.

FIG. 11 shows, in an illustration similar to FIG. 9, a further overall pupil facet arrangement on a variant of the pupil facet mirror 24 having a total of forty-eight pupil facets 25. Components corresponding to those which have already been explained above with reference to the pupil facet mirror 24 according to FIG. 9 bear the same reference numerals and will not be discussed in detail again.

Eight of the pupil facets 25z are arranged in the central location region 26 in the case of the overall arrangement according to FIG. 11. Sixteen of the pupil facets 25m are arranged in the central location region 27. Twenty-four of the pupil facets 25a are arranged in the outer location region 28 of the pupil facet mirror 24 according to FIG. 11.

In the case of the pupil facet mirror 25 according to FIG. 11, too, the pupil facets 25m and 25a are arranged in the location regions 27 and 28 in a manner spaced apart identically in the circumferential direction.

Figure 12:
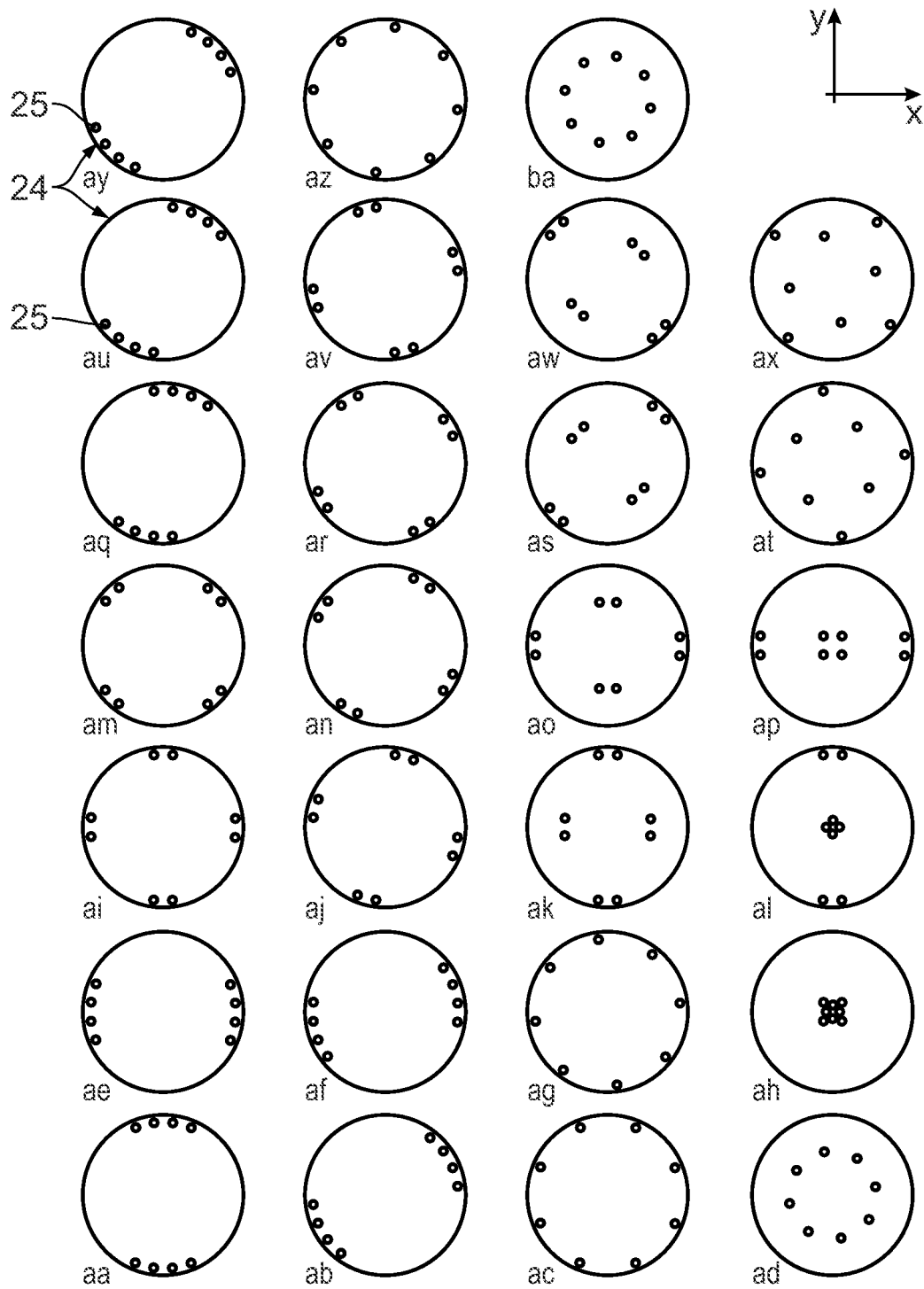
FIG. 12 shows illumination examples aa, ab . . . az, ba of the pupil facet mirror according to FIG. 11, in each case eight pupil facets being illuminated, the pupil facets being illustrated in each case with an exaggerated size in comparison with the size of the entire pupil.

FIG. 12 shows by way of example different illumination settings aa, ab, ac . . . az and ba which can be selected via a field facet mirror of the type of the field facet mirror 23 having a total of eight field facets 23a via the overall pupil facet arrangement according to FIG. 11. This once again results in, for example, dipole illumination settings, annular illumination settings, multipole illumination settings, quadrupole illumination settings and quadrupole illumination settings having different radial extents of poles rotated by 90° with respect to one another in the circumferential direction about the center Z.

In illumination systems without a pupil facet mirror, an illumination pupil is determined by the intensity distribution of an illumination of a pupil plane, in which an optical component need not necessarily be situated, with the illumination light. In the case of illumination systems comprising a specular reflector such as is known from DE 103 17 667 A1 or U.S. Pat. No. 2010/0231882 A1, no optical component of the illumination system is situated in the pupil plane. A configuration of the settable illumination pupils analogues to the configuration described here with the use of a pupil facet mirror allows a second faceted component of a specular reflector to be embodied in a static fashion. A displaceability of the facets of the second faceted element is not necessary in that case.

In order to produce a nano- or microstructured component, for example a semiconductor memory chip, the reticle 5 and the wafer 8 having a coating which is light-sensitive to the illumination light 9 are firstly provided. At least one section of the reticle 5 is then projected onto the wafer 8 with the aid of the projection exposure apparatus 1 or 21. Afterward, the light-sensitive layer on the wafer 8 that has been exposed with the illumination light 9 is developed.

Depending on the structure arrangement on the reticle 5 or depending on the resolution capability, a corresponding illumination setting is selected by via a corresponding selection of the illuminated specular facets 13 or of the pupil facets 25. This is carried out via corresponding predefinition of the tilting angles of the transfer facets 11 or of the field facets 23a via the central control device 4a.

What is claimed is:

1. An illumination optical unit configured to illuminate an illumination field with EUV illumination light, the illumination optical unit comprising:
    a specular facet mirror comprising a plurality of specular facets alongside one another, the specular facets being configured for the reflective, superimposing guidance of partial beams of a beam of the EUV illumination light to the object field,
    wherein:
        the specular facet mirror is a last component in a beam path of the illumination light upstream of the object field;
        the specular facet mirror is configured so that, for each of at least some of the specular facets:
            a position of the specular facet and an impingement region of an illumination light partial beam on the specular facet define an illumination direction for field points of the object field; and
            an edge contour of the impingement region of the illumination light partial beam on the specular facet defines a field shape of the object field; and
        each specular facet comprises a continuous static reflection surface.

2. The illumination optical unit of claim 1, wherein each specular facet is shaped so that, upon complete impingement, the specular facets define both the illumination direction for each field point and the field shape for the object field via their respective edge contour and the shape of their respective reflection surface.

3. The illumination optical unit of claim 1, wherein an edge contour of the specular facets has an aspect ratio of a first dimension y along the object displacement direction and a second dimension x perpendicular thereto which is less than an aspect ratio of corresponding dimensions of the object field.

4. The illumination optical unit of claim 1, wherein the specular facets are arranged on the specular facet mirror such that no two specular facets overlap one another along the object displacement direction.

5. The illumination optical unit of claim 1, further comprising a transfer facet mirror upstream of the specular facet mirror beam path of the illumination light, wherein:
    the transfer facet mirror comprises a plurality of transfer facets for the reflective guidance of the partial beams impinging on the specular facets so that object field illumination channels are defined via the transfer facets and the specular facets assigned via the reflective beam guidance;
    the object field illumination channels are configured so that the entire object field is in each case illuminatable with the illumination light; and
    the object field illumination channels are assigned in each case exactly one transfer facet and exactly one specular facet.

6. The illumination optical unit of claim 1, wherein, for each of at least some of the specular facets, a local angular bandwidth of an angle of incidence of the illumination light partial beam on the specular facet has a local angular bandwidth is less than 2°.

7. The illumination optical unit of claim 1, wherein an object field of a downstream imaging optical unit is arranged in the illumination field, and an object displaceable in an object displacement direction is arrangeable in the object field.

8. An optical system, comprising:
    an illumination optical unit according to claim 1; and
    a projection optical unit configured to image the object field into an image field.

9. The optical system of claim 8, wherein an entrance pupil of the projection optical unit is in the beam path downstream of the object field.

10. An illumination system, comprising:
    an illumination optical unit according to claim 1; and
    an EUV light source configured to generate the EUV illumination light.

11. A projection exposure apparatus, comprising:
    an illumination system comprising an illumination optical unit according to claim 1; and
    a projection optical unit configured to image the object field into an image field.

12. A method of using a projection exposure apparatus comprising an illumination system and a projection optical unit, the method comprising:
    using the illumination system to illuminate a reticle; and
    using the projection optical unit to project at least a portion of the illuminated reticle onto a light-sensitive material,
    wherein the illumination system comprises an illumination optical unit according to claim 1.

13. An illumination optical unit configured to illuminate an illumination field with EUV illumination light, an object field of a downstream imaging optical unit being arranged in the illumination field, an object displaceable in an object displacement direction being arrangeable in the object filed, the illumination optical unit comprising:
    a field facet mirror comprising a plurality of field facets for the reflective guidance of partial beams of a beam of the EUV illumination light; and
    a pupil facet mirror comprising a plurality of pupil facets so that a location distribution of pupil facets illuminated with the EUV illumination light defines an illumination angle distribution of the EUV illumination light in the object field;
    wherein:
        the field facets are configured to be imaged into the object field in a manner being superimposed on one another via the pupil facets;
        the pupil facets are arranged in location regions on the pupil facet mirror which are arranged in a manner spatially separated from one another by more than one pupil facet diameter from one another.

14. The illumination optical unit of claim 13, wherein at least one of the location regions is arranged as a ring on the pupil facet mirror.

15. The illumination optical unit of claim 13, wherein the pupil facet mirror comprises fewer than 100 pupil facets.

16. An optical system, comprising:
    an illumination optical unit according to claim 13; and
    a projection optical unit configured to image the object field into an image field.

17. An illumination system, comprising:
    an illumination optical unit according to claim 13; and
    an EUV light source configured to generate the EUV illumination light.

18. A projection exposure apparatus, comprising:
    an illumination system comprising an illumination optical unit according to claim 13; and a projection optical unit configured to image the object field into an image field.

19. A method of using a projection exposure apparatus comprising an illumination system and a projection optical unit, the method comprising:
   using the illumination system to illuminate a reticle; and
   using the projection optical unit to project at least a portion of the illuminated reticle onto a light-sensitive material,
   wherein the illumination system comprises an illumination optical unit according to claim 13.

20. An illumination optical unit configured to illuminate an illumination field with EUV illumination light, the illumination optical unit comprising:
   a specular facet mirror comprising a plurality of specular facets alongside one another, the specular facets being configured to reflect, superimpose and guide partial beams of a beam of the EUV illumination light to the illumination field, wherein:
   the specular facet mirror is a last component in a beam path of the illumination light upstream of the illumination field;
   the specular facet mirror is configured so that, for each of at least some of the specular facets:
      a position of the specular facet and an impingement region of an illumination light partial beam on the specular facet define an illumination direction for the field points of the illumination field; and
      an edge contour of the impingement region of the illumination light partial beam on the specular facet defines a field shape of the illumination field; and
   each specular facet comprises a continuous static reflection surface.

* * * * *

UNITED STATES PATENT AND TRADEMARK OFFICE
CERTIFICATE OF CORRECTION

PATENT NO. : 9,915,874 B2  
APPLICATION NO. : 15/061048  
DATED : March 13, 2018  
INVENTOR(S) : Michael Patra Page 1 of 1

It is certified that error appears in the above-identified patent and that said Letters Patent is hereby corrected as shown below:

In the Claims

Column 16, Line 34 (Claim 13): Delete "filed" and insert -- field --, therefor.

Signed and Sealed this
Fifth Day of June, 2018

Andrei Iancu
*Director of the United States Patent and Trademark Office*